(12) United States Patent
Dabov

(10) Patent No.: US 8,797,748 B2
(45) Date of Patent: Aug. 5, 2014

(54) ELECTRONIC DEVICES WITH TUBULAR FLEXIBLE CIRCUITRY

(75) Inventor: Teodor Dabov, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 85 days.

(21) Appl. No.: 13/316,348

(22) Filed: Dec. 9, 2011

(65) Prior Publication Data

US 2013/0148315 A1 Jun. 13, 2013

(51) Int. Cl.
*H05K 1/00* (2006.01)
(52) U.S. Cl.
USPC ............ 361/749; 361/748; 361/398; 254/250
(58) Field of Classification Search
USPC ........................... 361/749, 748, 398; 254/250
See application file for complete search history.

(56) References Cited

U.S. PATENT DOCUMENTS

| 7,275,562 | B2 | 10/2007 | Barth et al. |
| 2008/0238600 | A1 | 10/2008 | Olson |
| 2010/0303415 | A1 | 12/2010 | Hummer et al. |
| 2011/0019370 | A1 | 1/2011 | Koh |
| 2012/0287587 | A1* | 11/2012 | Los ............................... 361/749 |

FOREIGN PATENT DOCUMENTS

WO  2011087770  7/2011

\* cited by examiner

*Primary Examiner* — Andargie M Aychillhum
(74) *Attorney, Agent, or Firm* — Treyz Law Group

(57) ABSTRACT

An electronic device may be provided that has flexible circuitry such as spiral wrapped flexible circuitry. Flexible circuitry may be connected to one or more sides of an electronic component such as rigid printed circuit board or coupled between a rigid printed circuit board an another device component. Flexible circuitry may include an adhesive strip for maintaining a spiral wrap configuration of the flexible circuitry. An adhesive strip may be covered by a removable protective liner during manufacturing of an electronic device so that the flexible circuitry may be tested in a flat, unrolled configuration prior to installation in the electronic device. Flexible circuitry may include a conductive layer configured to form an electromagnetic shield for an electronic component mounted in the spiral wrap. Flexible circuitry may be wrapped around an elongated support member that is mounted along an edge of the electronic component.

15 Claims, 15 Drawing Sheets

ELECTRONIC DEVICES WITH TUBULAR FLEXIBLE CIRCUITRY

BACKGROUND

This relates generally to electronic devices, and more particularly, to electronic devices with flexible circuitry.

Electronic devices such as portable computers and cellular telephones are often provided with rigid components and flexible circuits. For example, a flexible printed circuit is often used to connect a rigid printed circuit board to other device components or to route electrical signals from one portion of a rigid printed circuit board to another portion of a rigid printed circuit board.

Flexible printed circuits are often mounted in a stack of components, thereby increasing the total thickness of the component stack. While flexible circuits are typically thin (less than 3 mm) even the additional thickness of a flex circuit in a component stack can be problematic in a compact electronic device.

It would therefore be desirable to be able to provide improved electronic devices.

SUMMARY

An electronic device may be provided that has tubular flexible circuitry.

Tubular flexible circuitry may be formed from a tubular flexible circuit printed circuit, a tubular flexible ribbon cable or other tubular flexible circuitry.

Tubular flexible circuitry may be formed from a tubular flexible substrate having an elongated opening, or may be formed from elongated flexible circuitry that is rolled or wrapped to form a tubular flexible circuitry. Wrapped flexible circuitry may be formed from a spirally wrapped flexible printed circuit, a spirally wrapped flexible ribbon cable, etc.

An electronic device may include additional circuitry such as integrated circuits coupled to the tubular flexible circuitry. Circuitry such as integrated circuits may be mounted to a printed circuit board. Tubular flexible circuitry may be connected to one or more locations on the printed circuit board.

For example, tubular circuitry may include a first end coupled to a first location on a printed circuit board and a second end coupled to a common or opposing side of the printed circuit. If desired, tubular flexible circuitry may include a first end coupled to a first location on a printed circuit board and a second end coupled to another device component such as a display, an additional printed circuit board, etc.

Flexible circuitry may include an adhesive strip for maintaining a wrapped tubular configuration of the flexible circuitry such as a spiral wrapped (or spirally wrapped) configuration. An adhesive strip may be covered by a removable protective liner during manufacturing of an electronic device so that the flexible circuitry may be tested in a planar configuration prior to installation in the electronic device.

Flexible circuitry may have multiple flexible layers. Flexible layers of flexible circuitry may include a conductive layer such as a conductive ground layer configured to form a conductive shield for an internal electronic component that is surrounded by, for example, a spiral wrapped flexible printed circuit.

Flexible circuitry may be mounted to a rigid support structure such as an elongated support member. An elongated support member may be formed from active or inactive components of the device. Elongated support members may be mounted to device housing structures, printed circuit boards or other device structures or components using screws or other fasteners, clips, protrusions and mating recesses, grooves, and other engagement features, glue, welds, or other suitable attachment mechanisms.

Further features of the invention, its nature and various advantages will be more apparent from the accompanying drawings and the following detailed description.

DETAILED DESCRIPTION

Electronic devices may include tubular flexible circuitry. Tubular flexible circuitry may include a flexible printed circuit of flexible ribbon cable. Tubular flexible circuitry may be formed from a spiral roll of flexible circuitry in an extended internal volume of an electronic device. Mounting tubular flexible circuitry in an extended internal volume may help reduce the thickness of component stacks in the electronic device thereby helping reduce the overall thickness of the device. Tubular flexible circuitry may be used to electrically connect multiple rigid components in the electronic device or to transmit electrical signals from one portion of an electronic component such as a printed circuit board to another portion of the electronic component.

Figure 1:
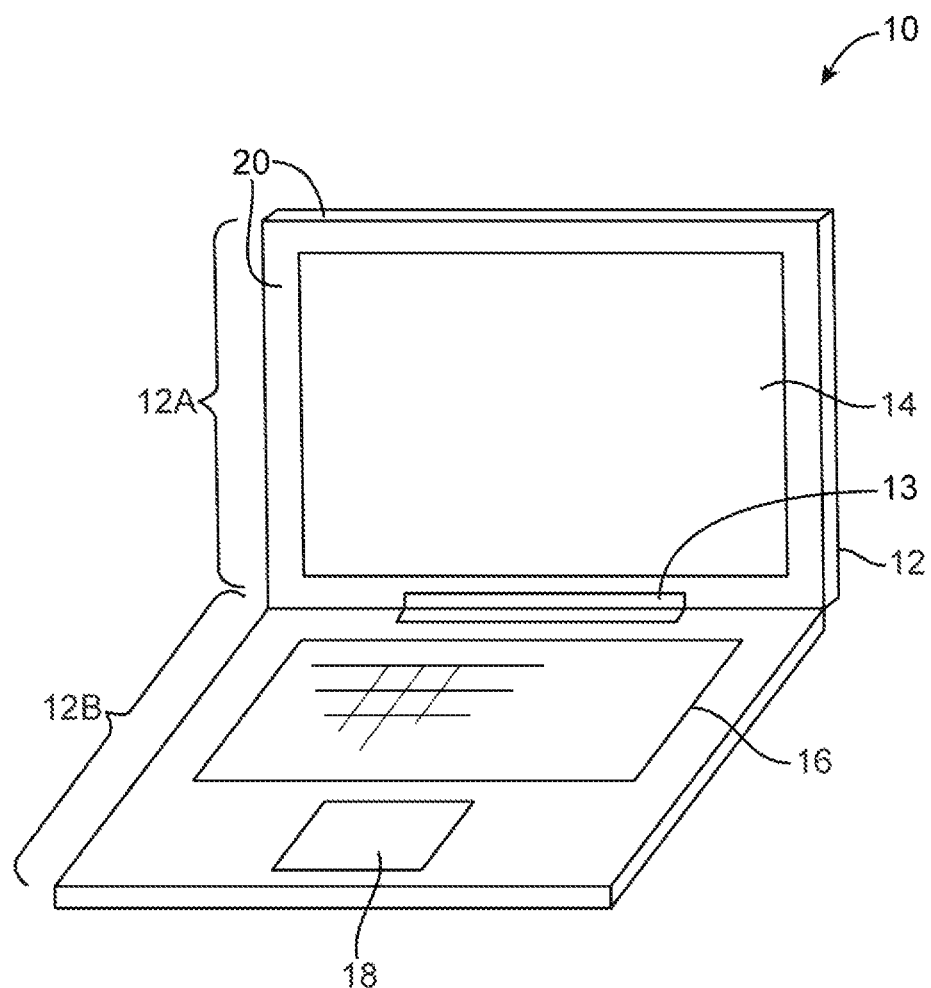
FIG. 1 is a perspective view of an illustrative electronic device such as a laptop computer with a display in accordance with an embodiment of the present invention.
Figure 2:
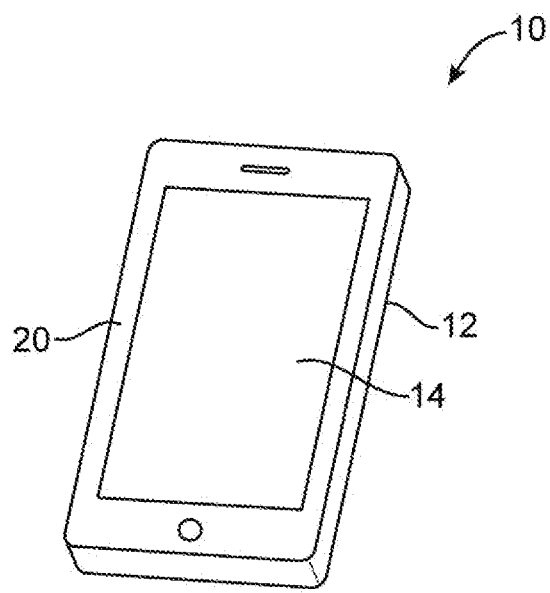
FIG. 2 is a perspective view of an illustrative electronic device such as a handheld electronic device with a display in accordance with an embodiment of the present invention.
Figure 3:
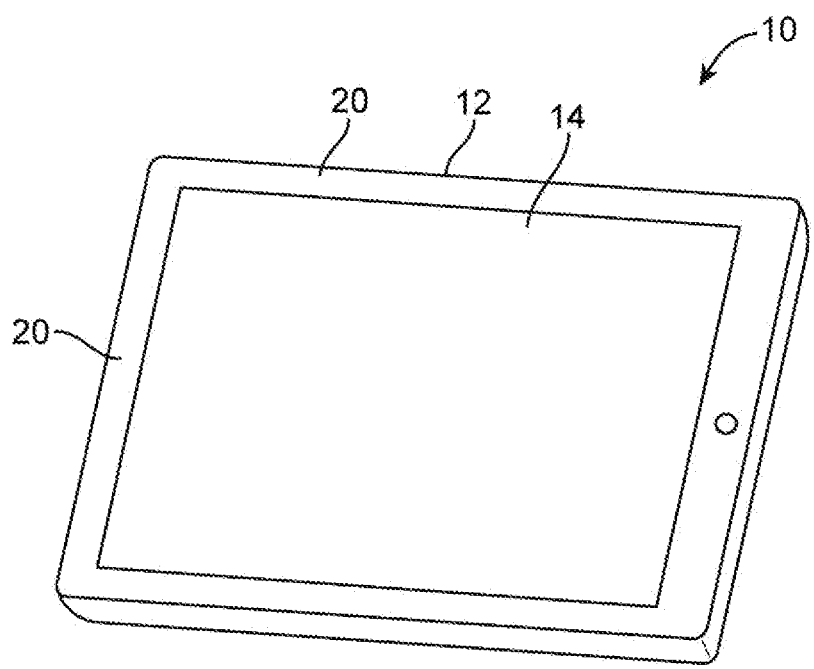
FIG. 3 is a perspective view of an illustrative electronic device such as a tablet computer with a display in accordance with an embodiment of the present invention.

Illustrative electronic devices that may be provided with tubular flexible circuitry are shown in FIGS. 1, 2, and 3. FIG. 1 shows how electronic device 10 may have the shape of a laptop computer having upper housing 12A and lower housing 12B with components such as keyboard 16 and touchpad 18. Tubular flexible printed circuits may be used to couple circuitry such as electronic components mounted in upper housing 12A to circuitry such as electronic components mounted in lower housing 12B. Portions of a tubular flexible printed circuit may extend from a portable computer clutch barrel such as clutch barrel 13 into upper and lower housing portions 12A and 12B for connection to electrical components of device 10.

FIG. 2 shows how electronic device 10 may be a handheld device such as a cellular telephone, music player, gaming device, navigation unit, or other compact device. FIG. 3 shows how electronic device 10 may be a tablet computer. These are merely illustrative examples. Electronic devices such as illustrative electronic device 10 of FIGS. 1, 2, and 3 may be laptop computers, computer monitors with embedded computers, tablet computers, cellular telephones, media players, other handheld and portable electronic devices, smaller devices such as wrist-watch devices, pendant devices, headphone and earpiece devices, other wearable and miniature devices, or other electronic equipment.

Device 10 may have one or more housing structures such as housing 12. Housing 12, which is sometimes referred to as a case, may be formed of materials such as plastic, glass, ceramics, carbon-fiber composites and other composites, metal, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may have one or more displays such as display 14. Display 14 may be an organic light-emitting diode (OLED) display or other suitable display. Display 14 may include display pixels formed from light-emitting diodes (LEDs), organic LEDs (OLEDs), plasma cells, electronic ink elements, liquid crystal display (LCD) components, or other suitable display pixel structures compatible with flexible displays. Display 14 may, if desired, include capacitive touch sensor electrodes for a capacitive touch sensor array or other touch sensor structures (i.e., display 14 may be a touch screen). Touch sensor electrodes may be provided on a touch panel layer that is interposed between an organic light-emitting diode display layer and a transparent cover layer (e.g., a cover glass layer), may be formed on the underside of a cover layer, or may otherwise be incorporated into display 14.

The display (sometimes referred to as the display layer, the OLED display, the flexible display or flexible OLED display) may have a planar rectangular active region in its center. The rectangular active region may include an array of light-emitting diode pixels. Display 14 may include an inactive portion at the edges of display 14. The inactive portion of the display is shown as inactive border region 20 in FIGS. 1, 2, and 3.

To enhance device aesthetics, the thickness of electronic device 10 may be reduced by coupling electronic components together in device 10 using tubular flexible circuitry such as a tubular flexible printed circuit mounted in an extended internal volume adjacent to the electronic components.

Figure 4:
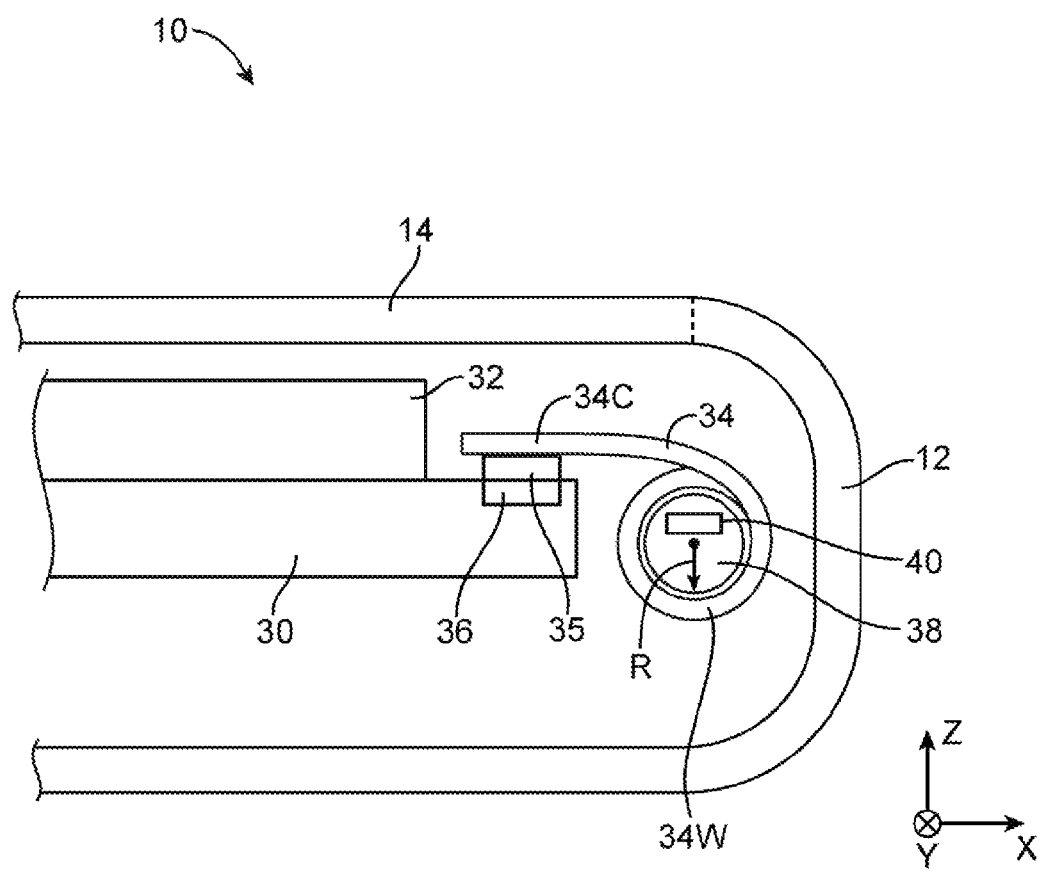
FIG. 4 is a cross-sectional side view of a portion of an illustrative electronic device having flexible circuitry that runs around a rigid support member in accordance with an embodiment of the present invention.

A cross-sectional side view of a portion of an illustrative electronic device having tubular flexible circuitry is shown in FIG. 4. As shown in FIG. 4, device 10 may include one or more components such as components 30 and components 32 mounted in a housing such as housing 12. In the example of FIG. 4, housing 12 and a display such as display 14 form an enclosure in which components 30 and 32 are mounted. However, this is merely illustrative. Components 30 and 32 may be fully enclosed by housing 12, may be fully enclosed by display 14 or may be otherwise mounted in device 10.

Components such as component 32 may be active or inactive components of device 10. Components 30 may include rigid support structures or may include a device component such as a battery, printed circuit board (PCB) or other active component or electrical component (e.g., a capacitor, a resistor, a speaker, a vibrator, an actuator, etc.). Component 32 may be mounted to device housing 12, to component 30, to display 14 or otherwise mounted in device 10. Component 32 may, for example, be an integrated circuit mounted to component 30. Component 32 may be a separate electronic component mounted to component 30 using a layer of adhesive interposed between component 30 and component 32. Components 30 and 32 may, for example, be mounted to device housing structures such as housing 12 using screws or other fasteners, clips, protrusions and mating recesses, grooves, and other engagement features, glue, welds, or other suitable attachment mechanisms.

Component 30 may be an electronic component such as a printed circuit, a printed circuit board, an integrated circuit, or other electronic component. Printed circuit 30 and other printed circuits in device 10 may be formed from rigid printed circuit board material (e.g., fiberglass-filled epoxy), flexible sheets of material such as polymers, or a combination of rigid and flexible materials (sometimes referred to as "rigid-flex" printed circuit boards).

As shown in FIG. 4, device 10 may be provided with tubular flexible circuitry such as flexible circuitry 34. Flexible circuitry 34 may include a flexible printed circuit, a flexible ribbon cable or other flexible circuitry. Flexible printed circuits ("flex circuits") such as flexible circuitry 34 may, for example, be formed using printed conductive traces on flexible sheets of polyimide. Tubular flexible circuitry 34 may be connected to a portion of a printed circuit board such as printed circuit 30. Flexible circuitry 34 may have a tubular portion that is wrapped around a support member such as support member 38. Support member 38 may be an inactive or active component of device 10. For example, support member 38 may include an inactive support structure formed from a material such as plastic, metal, a fiber-composite material, ceramic, other materials, or combinations of these materials. If desired, support member 38 may include an active component such as a cylindrical battery cell.

Support member 38 may have a curved outer surface. For example, support member 38 may be characterized by a minimum bend radius R. The size of bend radius R may be selected to prevent damage to flexible circuitry 34. For example, the size of R may be 1 mm, 2 mm, less than 3 mm, less than 2 mm, less than 1 mm, or less than 0.5 mm (as examples).

Flexible circuitry 34 may be have a tubular portion such as portion 34W that is wrapped around support member 38 in, for example, a spiral wrap that extends along a dimension parallel to the y-axis of FIG. 4. Flexible circuitry 34 may have one or more portions such as portion 34C that extend from support member 38 in the direction of printed circuit 30 and that are electrically coupled to printed circuit 30. However, this is merely illustrative. If desired, support member 38 may be a temporary support member for inserting rolled printed circuit 34 into device 10 during manufacturing of device 10. If desired, support member 38 may be removed from wrapped portion 34W of flexible circuitry 34 prior to completion of manufacturing of device 10.

Flexible circuitry 34 may have first and second ends that are provided with one or more connectors such as connector 35 for connecting flexible circuitry 34 to a printed circuit board or other component such as component 30. Connector 35 may be formed from any suitable connection mechanism such as a Zero Insertion Force (ZIF) connector, a board-to-board connector, a 16-pin connector, a wired connection, a wire bond connection, etc. In the example of FIG. 4, connector 35 of flexible circuitry 34 is a conductive contact connected to a contact pad such as bond pad 36 on printed circuit 30. Connector 35 of flexible circuitry 34 may be connected to bond pad 36 using, for example, anisotropic conductive film (ACF). Bond pad 36 may be connected to one or more conductive traces in printed circuit 30.

As shown in FIG. 4, device 10 may be provided with additional electronic components such as component 40 that are at least partially surrounded by wrapped portion 34W (sometimes called tubular portion 34W) of flexible circuitry 34. Component 40 may be an integrated circuit, a speaker, a light-emitting diode (LED), a vibrator, an actuator, or other electronic component. If desired, flexible circuitry 34 may include a conductive ground layer that, in the wrapped configuration of FIG. 4, provides electrical shielding for components such as component 40.

Flexible circuitry 34 may have an end such as portion 34C having a connector such as connector 35 connected to printed circuit 30 and an opposing end 34C having an additional connector 35 that makes an electrical connection elsewhere in device 10 (e.g., to another portion of printed circuit 30, to another electronic component such as component 32, to another printed circuit board, to display 14, etc.).

Figure 5:
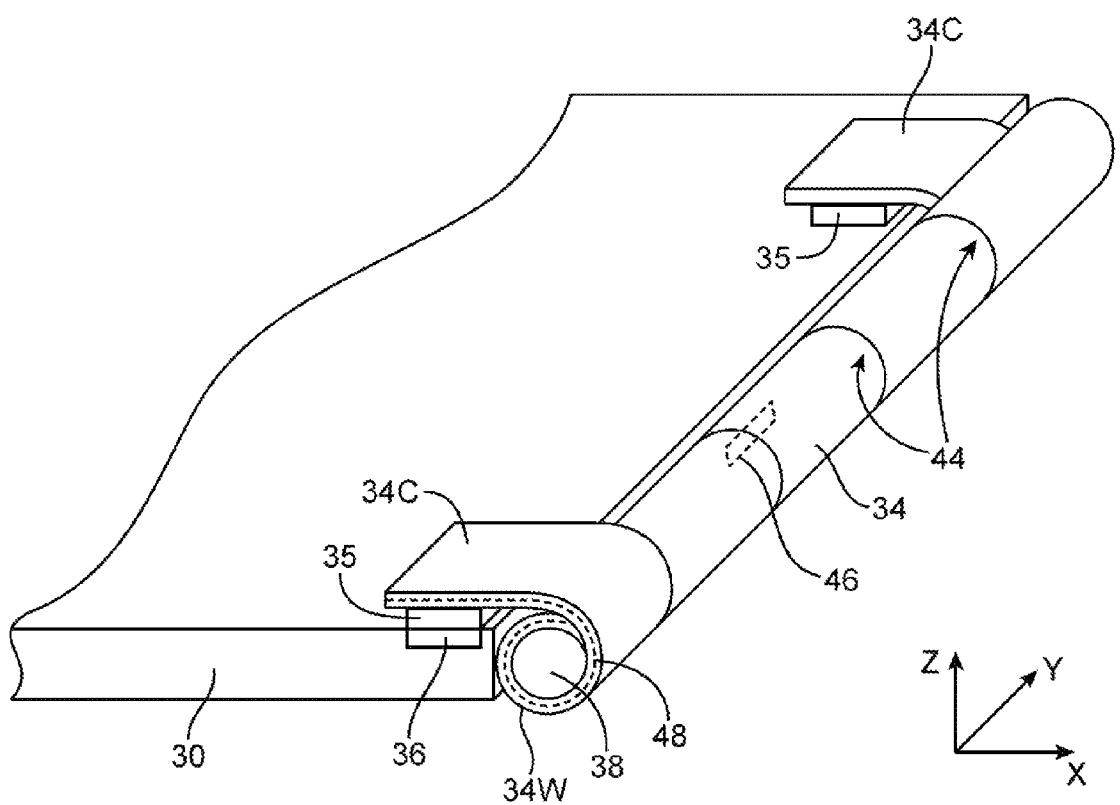
FIG. 5 is a perspective view of illustrative flexible circuitry connected to multiple contacts on a rigid printed circuit in accordance with an embodiment of the present invention.

As shown in FIG. 5, tubular flexible circuitry 34 may be formed from a spirally wrapped flexible printed circuit. In the example of FIG. 5, spiral wrapped flexible circuitry 34 is configured to carry electrical signals between multiple contacts on a common side of printed circuit 30. Flexible circuitry 34 may be wrapped or rolled around support member 38 such that a connector such as connector 35 on first portion 34C is connected to a bond pad 36 on a first portion of a printed circuit board such as component 30 and a second connector 35 on a second portion 34C is connected to a second bond pad 36 on a different portion of component 30. Flexible circuitry 34 may be wrapped around support member 38 in a spiral wrap that extends along a lateral dimension of component 30 parallel to the y-axis of FIG. 5.

A spiral wrapped flexible printed circuit such as flexible circuitry 34 may have seams such as seams 44. Seams 44 may be partially overlapping seams (e.g., one portion of flexible circuitry 34 may overlap another portion of flexible circuitry 34) or seams 44 may be formed from abutting edges of flexible circuitry 34.

This is merely illustrative. If desired, flexible circuitry 34 may be formed from a single tubular flexible substrate having an opening in which support member 38 may be inserted.

If desired, flexible printed circuit may include a conductive ground layer such as layer 48. Flexible circuitry 34 may include conductive contacts such as contact 46 that electrically couple layer 48 across seams 44 so that layer 48 forms a continuous conductive shield at least partially surrounding support member 38 or another component mounted within a space created by wrapped portion 34W of circuit 34.

Figure 6:
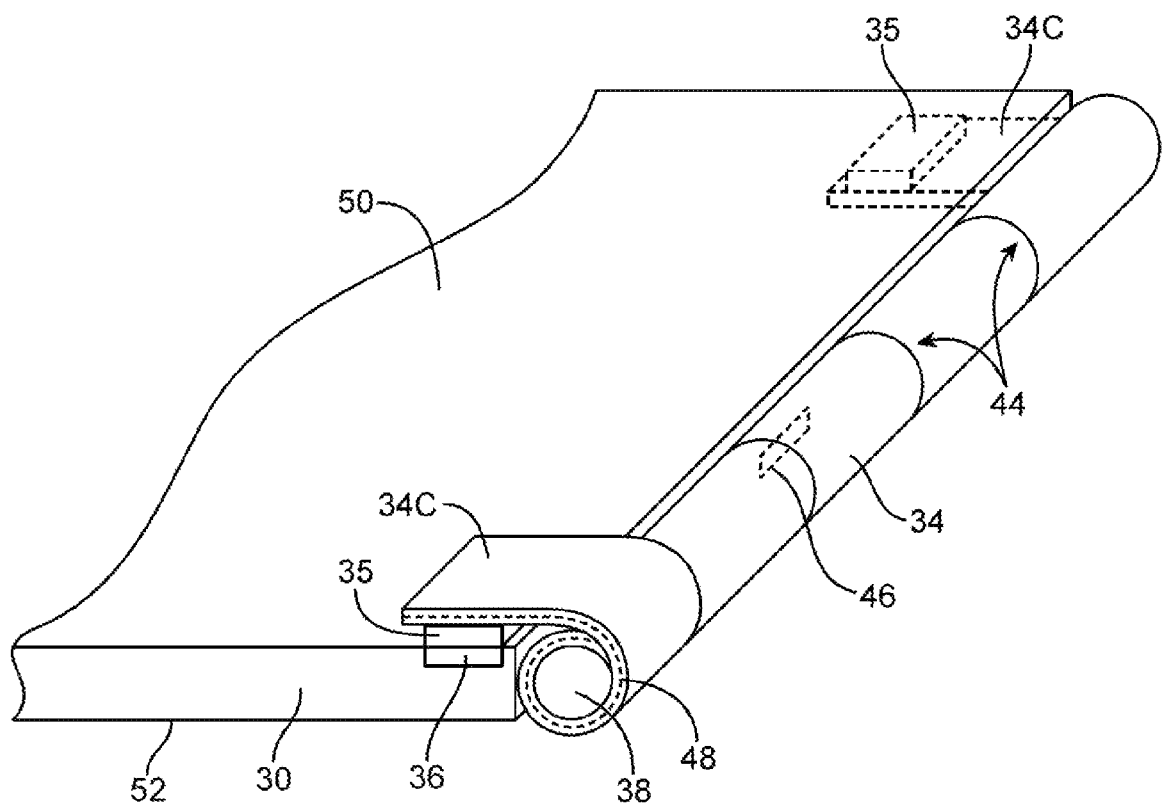
FIG. 6 is a perspective view of illustrative flexible circuitry connected to multiple contacts on opposing sides of a rigid printed circuit in accordance with an embodiment of the present invention.

In the example of FIG. 5, tubular flexible circuitry 34 is coupled to bond pads 36 on a common surface of component 30. However, this is merely illustrative. If desired, tubular flexible circuitry 34 may be configured to connect to bond pads (or other connectors) on opposing sides of a component such as component 30 as shown in FIG. 6. In the example of FIG. 6, flexible circuitry 34 is configured to couple a contact pad such as bond pad 36 on top surface 50 of component 30 to a second contact pad 36 on an opposing bottom surface such as surface 52 of component 30. In configurations in which flexible circuitry 34 is coupled to bond pads on opposing sides of a printed circuit board such as component 30, flexible circuitry may be formed from a wrapped flexible printed circuit including conductive connectors 35 on opposing sides of flexible circuitry 34.

Figure 7:
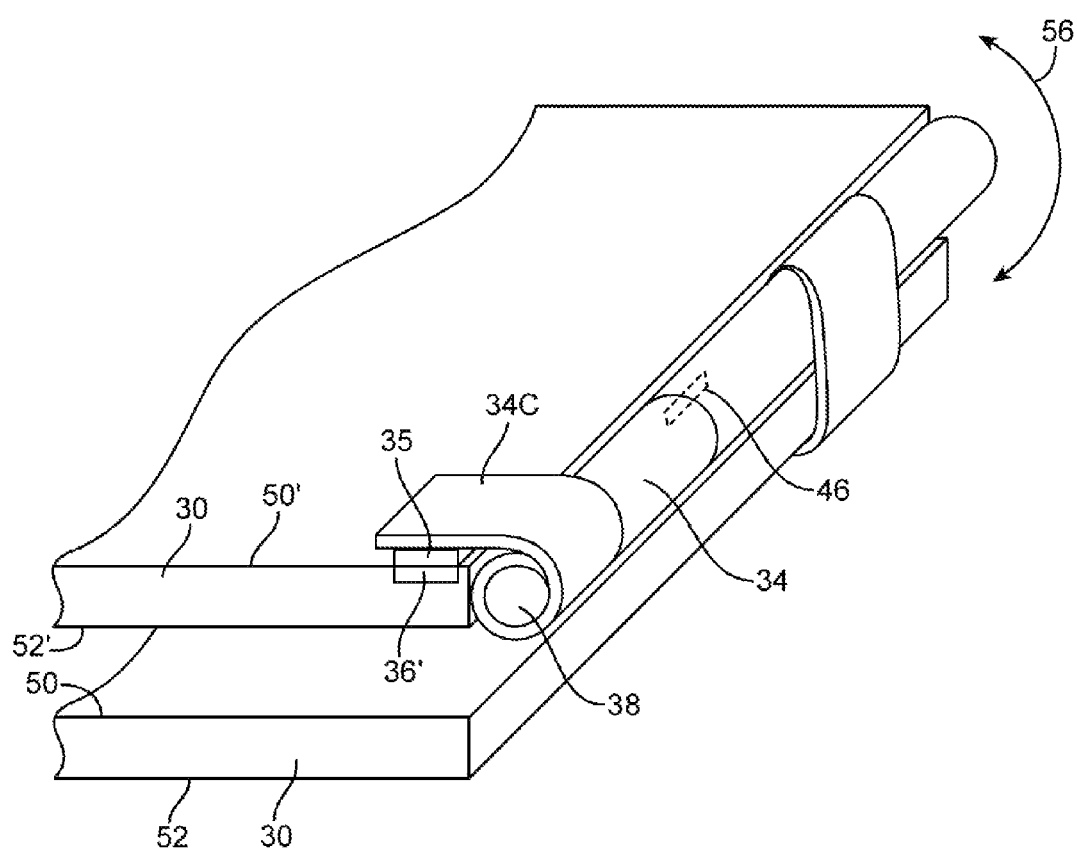
FIG. 7 is a perspective view of illustrative flexible circuitry connected to multiple internal electronic components of an electronic device in accordance with an embodiment of the present invention.

As shown in FIG. 7, rolled flexible circuitry 34 may be configured to electrically connect a first component such as component 30 to a second component such as component 30'. Second component 30' may be a printed circuit board, a display such as display 14, control circuitry, an integrated circuit or other electronic component. If desired, components 30 and 30' may be mounted in lower and upper portions of an electronic device 10 such as lower and upper housings 12B and 12A, respectively, of FIG. 1.

For example, component 30 may be a printed circuit board mounted in lower housing portion 12B that is coupled to a component 30' such as display 14 mounted in upper housing 12A. If desired, component 30 may be configured to move with respect to component 30' (e.g., using a hinge structure in housing 12 that allows upper and lower portions 12A and 12B to pivot as indicated by arrows 56).

For example, support member 38 and an associated flexible circuitry 34 that is wrapped around support member 38 may, for example, be mounted in a portable computer clutch barrel such as clutch barrel 13 (see FIG. 1) containing hinges that allow the lid of the portable computer to open and close. Portions 34C may extend from portable computer clutch barrel 13 into upper and lower housing portions 12A and 12B for connection to components such a components 30 and 30'.

In configurations in which component 30 is configured to move with respect to component 30', flexible circuitry 34 may be loosely wrapped around support member 38 so that flexible circuitry 34 can couple to components 30 and 30' without generating strain on connectors 35 that couple flexible circuitry 34 to components 30 and 30'.

As shown in FIG. 7, a first portion 34C of flexible circuitry 34 may include a connector 35 that is coupled to a contact pad such as bond pad 36' on a top surface 50' of component 30'. Flexible circuitry 34 may include a connector 35 that is coupled to a contact pad such as bond pads 36 on a bottom surface 52 of component 30 (see, e.g., FIG. 6). However, this is merely illustrative. If desired, flexible circuitry 34 may be connected to top surface 50', bottom surface 52' or elsewhere on component 30'. If desired, flexible circuitry 34 may be connected to top surface 50, bottom surface 52 or elsewhere on component 30.

Figure 8:
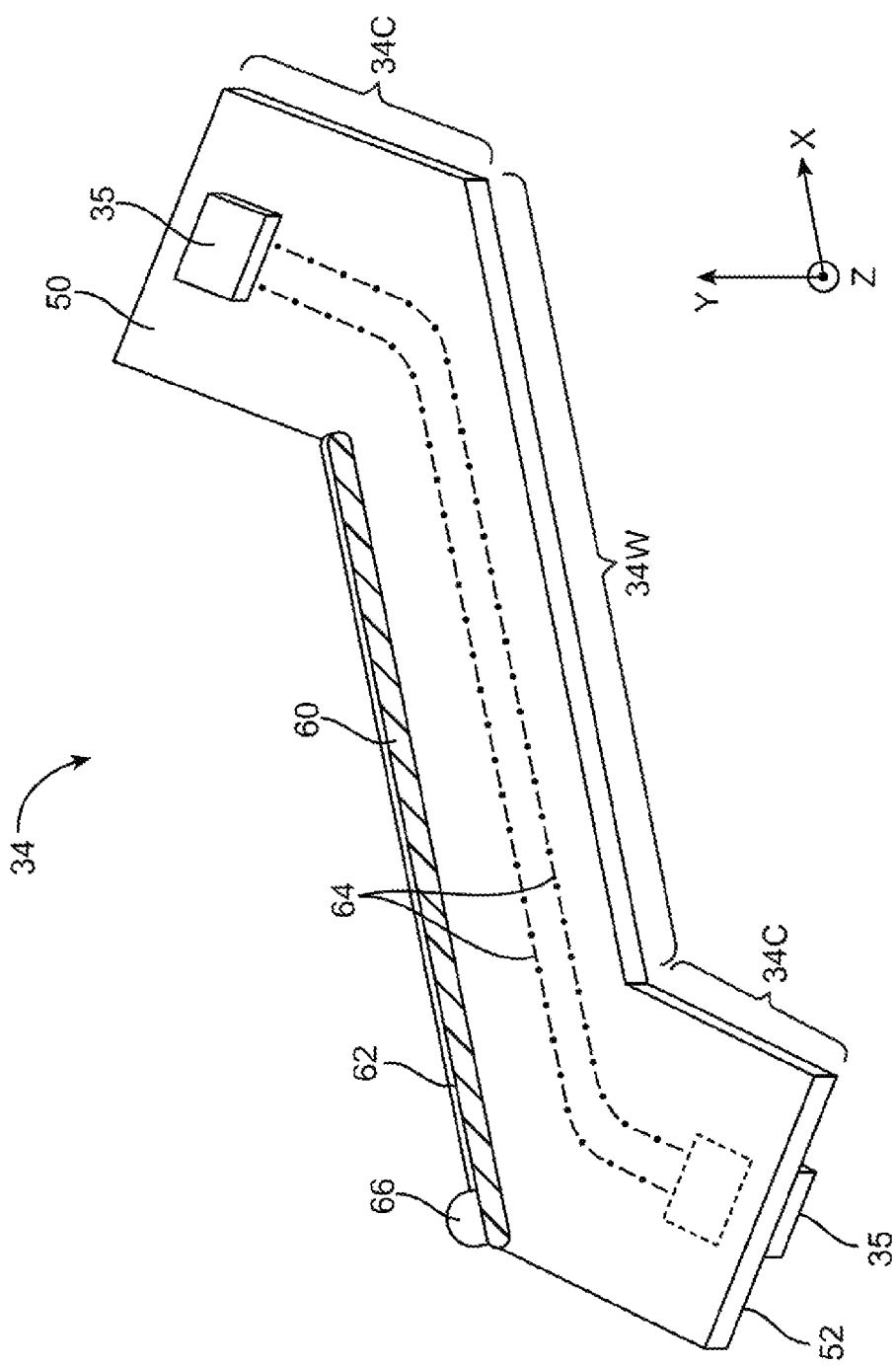
FIG. 8 is a perspective view of illustrative flexible circuitry having an adhesive strip with a removable cover and connectors on opposing sides in accordance with an embodiment of the present invention.

In configurations in which flexible circuitry 34 is coupled to bond pads on a common side of components such as components 30 and/or 30', flexible circuitry may include conductive connectors 35 on opposing sides of flexible circuitry 34 as shown in FIG. 8.

FIG. 8 is a perspective view of flexible circuitry 34 showing how connectors 35 may be formed on extended portions 34C. Flexible circuitry 34 may be configured to be able to be laid substantially flat (e.g., in a planar configuration in the x-y plane shown in FIG. 8). Flexible circuitry 34 may be laid flat in a planar configuration for testing and configuration of flexible circuitry 34 during manufacturing of device 10.

Flexible circuitry 34 may be configured to have a substantially planar portion 34W (when laid flat) that is parallel to the x-y plane and extends along a lateral dimension parallel to the x-axis shown in FIG. 8. Flexible circuitry 34 that can be laid flat may allow testing of flexible circuitry 34 using simplified testing systems. Flexible circuitry may be configured to have end portions 34C that form additional planar portions (when laid flat) in the x-y plane and extending along a lateral dimension between the x and y axes shown in FIG. 8. Conductive paths such as traces 64 may be formed within flexible circuitry 34 that electrically couple connectors 35 on opposing ends 34C of flexible circuitry 34.

Flexible circuitry 34 may include a strip of adhesive such as adhesive 60 that runs along an edge of portion 34W. Adhesive 60 may be a pressure sensitive adhesive or other type of adhesive. Adhesive 60 may be provided with a removable protective liner such as layer 62 that covers adhesive 34 during shipping, testing, and manufacturing of flexible circuitry 34. Protective layer 62 may be provided with an extended portion such as pull tab 66. Pull tab 66 may help a technician remove layer 62 from adhesive 60 so that flexible circuitry 34 may be rolled or wrapped around a support member for installation into device 10.

During manufacturing of device 10, flexible circuitry 34 may be wrapped so that adhesive 60 on a first side of circuitry 34 (e.g., top side 50) bonds to an opposing side (e.g., bottom side 52) of portion 34W at seams (see, e.g., FIG. 6). Adhesive 60 may be configured to help flexible circuitry 34 that has been rolled or wrapped for insertion into a device such as device 10 of FIG. 1 maintain a rolled or spiral wrapped configuration.

The example of FIG. 8 in which connectors 35 are formed on opposing sides of flexible circuitry 34 is merely illustrative. In configurations in which flexible circuitry 34 is coupled to bond pads on opposing sides of components such as components 30 and/or 30', flexible circuitry may include conductive connectors 35 on a common side of flexible circuitry 34 as shown in FIG. 9.

Figure 9:
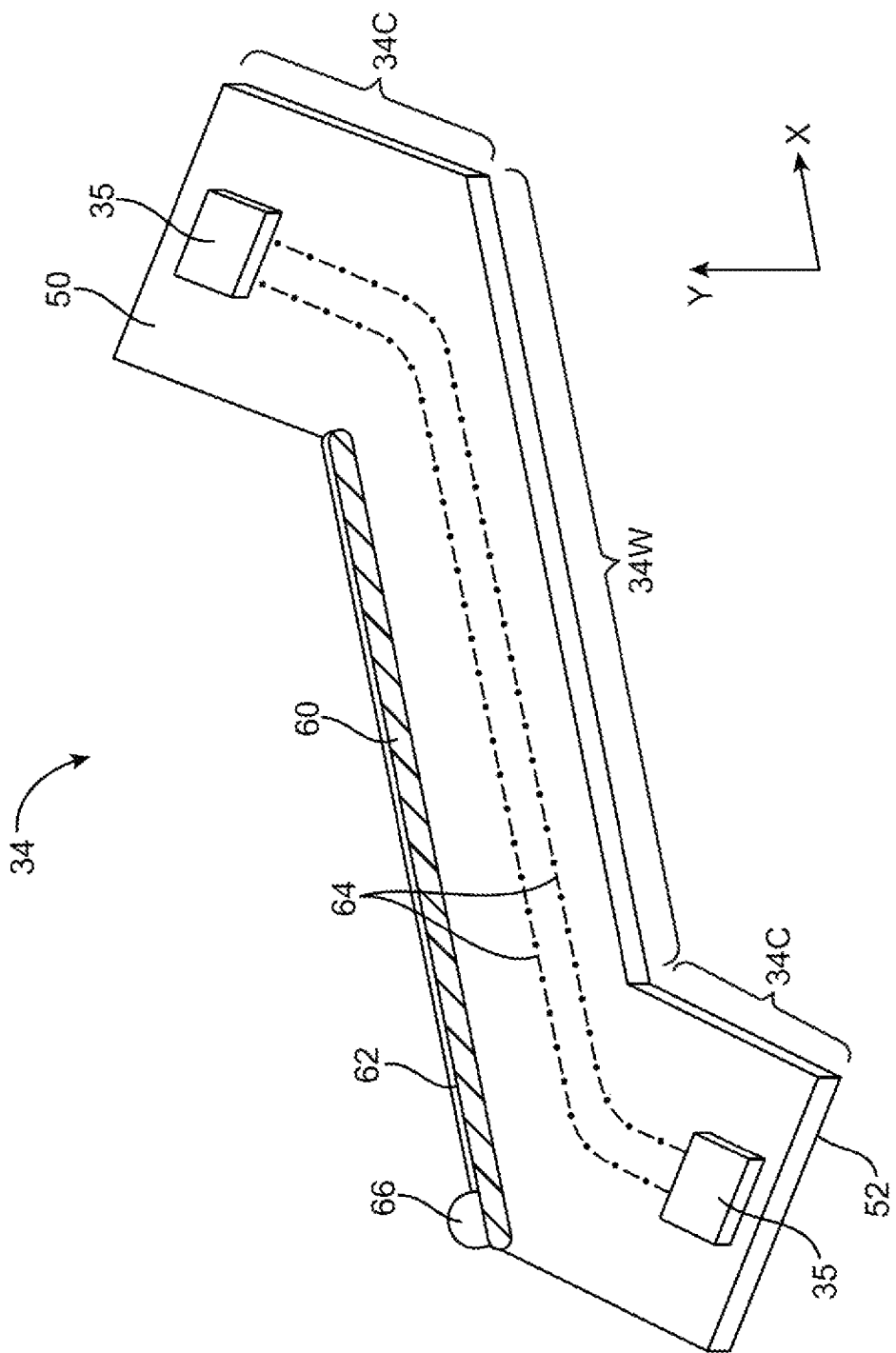
FIG. 9 is a perspective view of illustrative flexible circuitry having an adhesive strip with a removable cover and multiple connectors on a common side in accordance with an embodiment of the present invention.

As shown in FIG. 9, flexible circuitry 34 may include connectors 35 on a common side (e.g., top side 50) of extended portions 34C. Flexible circuitry 34 having connectors 35 on a common side (e.g., top side 50) of extended portions 34C may be laid flat in a planar configuration for testing and configuration of flexible circuitry 34 during manufacturing of device 10.

Extended portions 34C having connectors 35 on a common side may be configured to form planar portions (when laid flat) in the x-y plane and extending along a lateral dimension between the x and y axes shown in FIG. 9.

Figure 10:
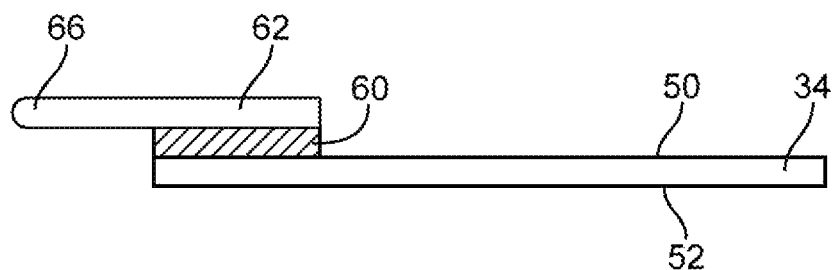
FIG. 10 is a cross-sectional side view of illustrative flexible circuitry having an adhesive strip with a removable cover in accordance with an embodiment of the present invention.

As shown in FIG. 10, adhesive 60 may be formed on a surface such as top surface 50 of flexible circuitry 34 along an edge of flexible circuitry 34. Protective layer 62 may be configured to cover adhesive 60. Extended portion 66 may extend from an edge of flexible circuitry 34 to aid in removing protective layer 62 from adhesive 34 during assembly of a device such a device 10.

Figure 11:
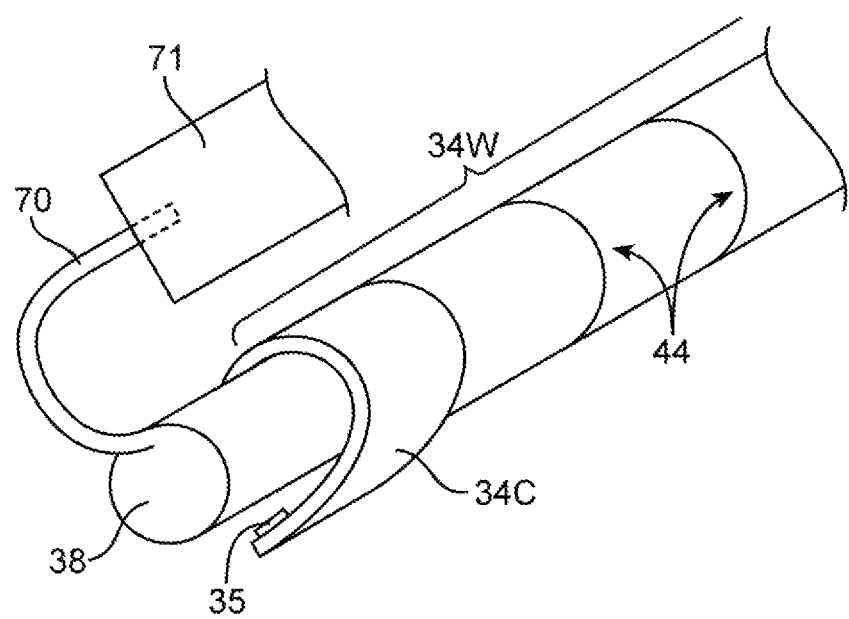
FIG. 11 is a perspective view of a portion of illustrative flexible circuitry mounted to a rigid support structure in accordance with an embodiment of the present invention.

A support member such as support member 38 for wrapping flexible circuitry 34 may, if desired, include an engagement member such as engagement member 70 as shown in FIG. 11. Engagement member 70 may be used to mount support member 38 to other structures such as structure 71 of device 10. Structure 71 may be a portion of, for example, housing 12, component 30, component 32, or display 14 (see, e.g., FIG. 4) of device 10. Engagement member 70 may include one or more hooks, screws or other fasteners, clips, protrusions or mating recesses, grooves, welded portions, or other suitable attachment mechanisms.

Figure 12:
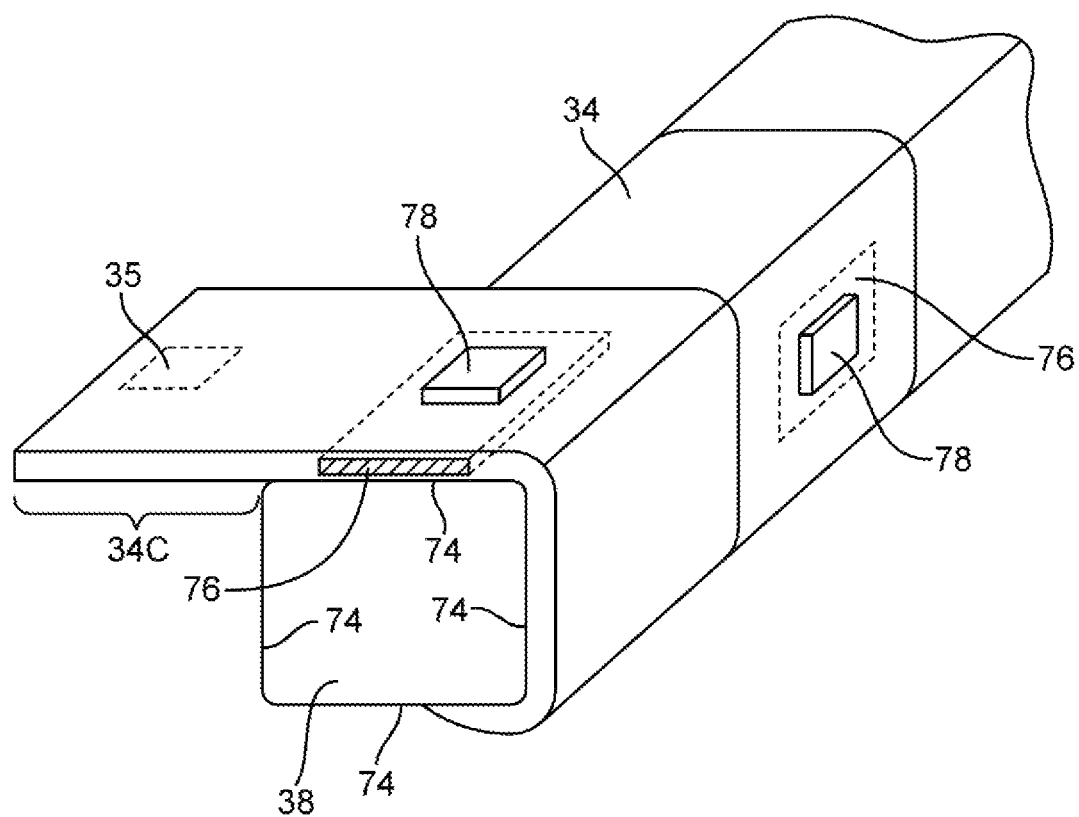
FIG. 12 is a perspective view of a portion of illustrative flexible circuitry wrapped around a rigid support structure having planar surfaces in accordance with an embodiment of the present invention.

If desired, support member 38 may have one or more planar surfaces as shown in FIG. 12. As shown in FIG. 12, flexible circuitry 34 may be wrapped around support member 38 having planar surfaces 74. Portions of flexible circuitry 34 that are wrapped adjacent to planar surfaces 74 of support member 38 may be provided with additional electronic components such as components 78 mounted to flexible circuitry 34. Components 78 may include integrated circuits, discrete components such as resistors, capacitors, and inductors, and other electronic components.

Flexible circuitry 34 may include one or more internal rigid members such as stiffeners 76. Components 78 may be mounted to flexible circuitry 34 over stiffeners 76. Stiffeners 76 may be configured to locally stiffen flexible circuitry 34 to prevent bending of flexible circuitry 34 in the vicinity of a component such as components 78 in order to prevent damage or dislodging of components 78.

Figure 13:
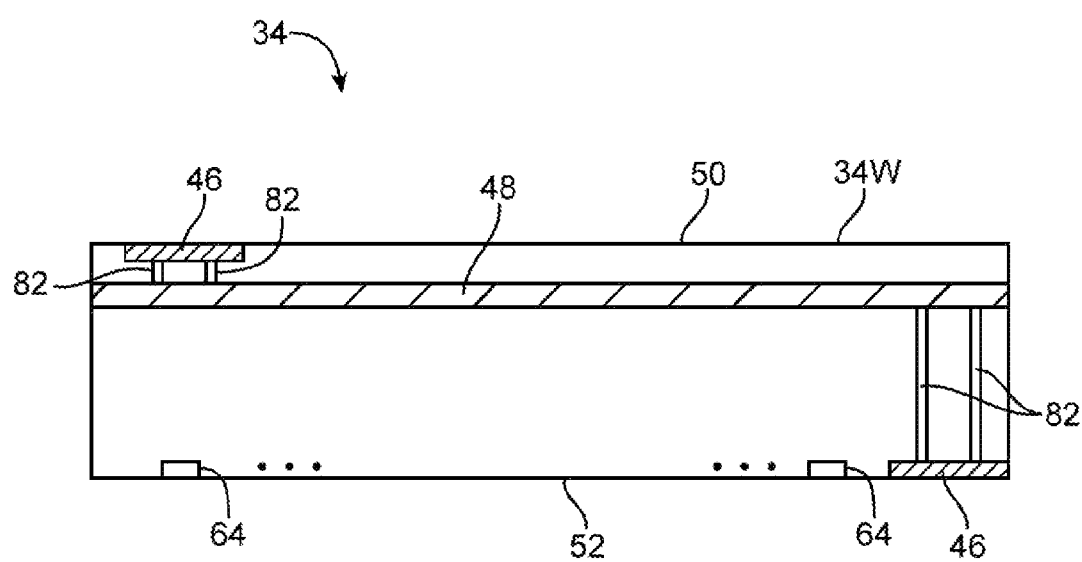
FIG. 13 is a cross-sectional side view of illustrative flexible circuitry having a conductive ground layer in accordance with an embodiment of the present invention.

FIG. 13 is a cross-sectional end view of portion 34W of flexible circuitry 34 showing how flexible circuitry 34 may include a conductive ground layer such as ground layer 48. Flexible circuitry 34 may be formed from one or more flexible substrate layers. Conductive lines such as traces 64 may be formed on a surface of one or more flexible substrate layers within or on flexible circuitry 34.

As shown in FIG. 13, flexible circuitry 34 may include conductive contacts such as contacts 46 that electrically couple layer 48 to surfaces 50 and 52 of flexible circuitry 34. Conductive vias such as vias 82 may be formed in flexible circuitry 34 to form a conductive bridge between layer 48 and contacts 46 on surfaces 50 and 52.

Figure 14:
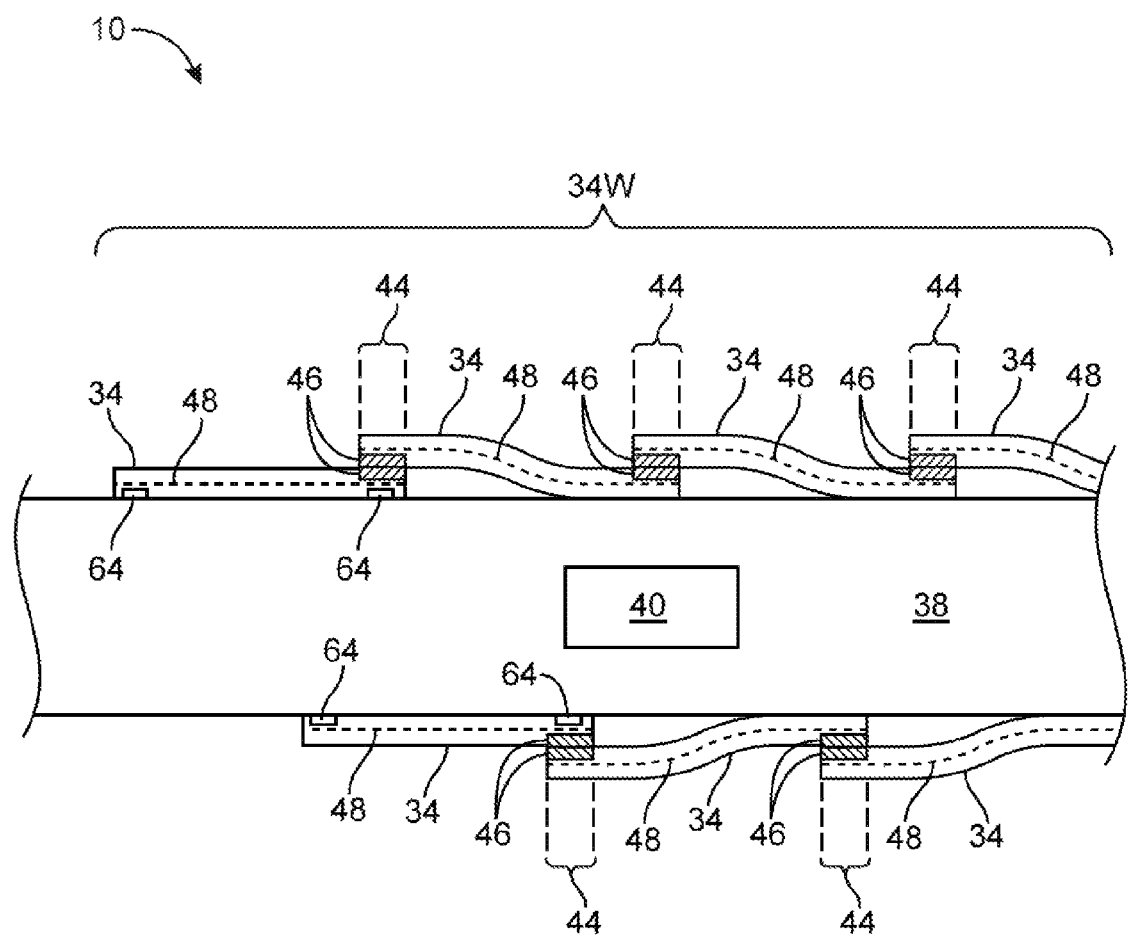
FIG. 14 is a cross-sectional side view of illustrative flexible circuitry of the type shown in FIG. 13 showing how a ground layer in wrapped flexible circuitry may form a conductive shield in accordance with an embodiment of the present invention.

Flexible circuitry 34 may be wrapped around a support member such as support member 38 so that contacts 46 on top surface 50 are mounted in contact with contacts 46 of opposing surface 52 at seams 44 as shown in FIG. 14. Conductive layer 48 may be coupled to contacts 46 at seams 44 so that layer 48 forms a continuous conductive shield. The continuous conductive shield formed by layer 48 and contacts 46 may at least partially surround support member 38 and/or another component such as component 40 mounted within a space created by wrapped portion 34W of circuit 34. Component 40 may be mounted within support member 38, as an integrated portion of member 38, or in a space created by wrapped portion 34W that is separate from member 38.

Figure 15:
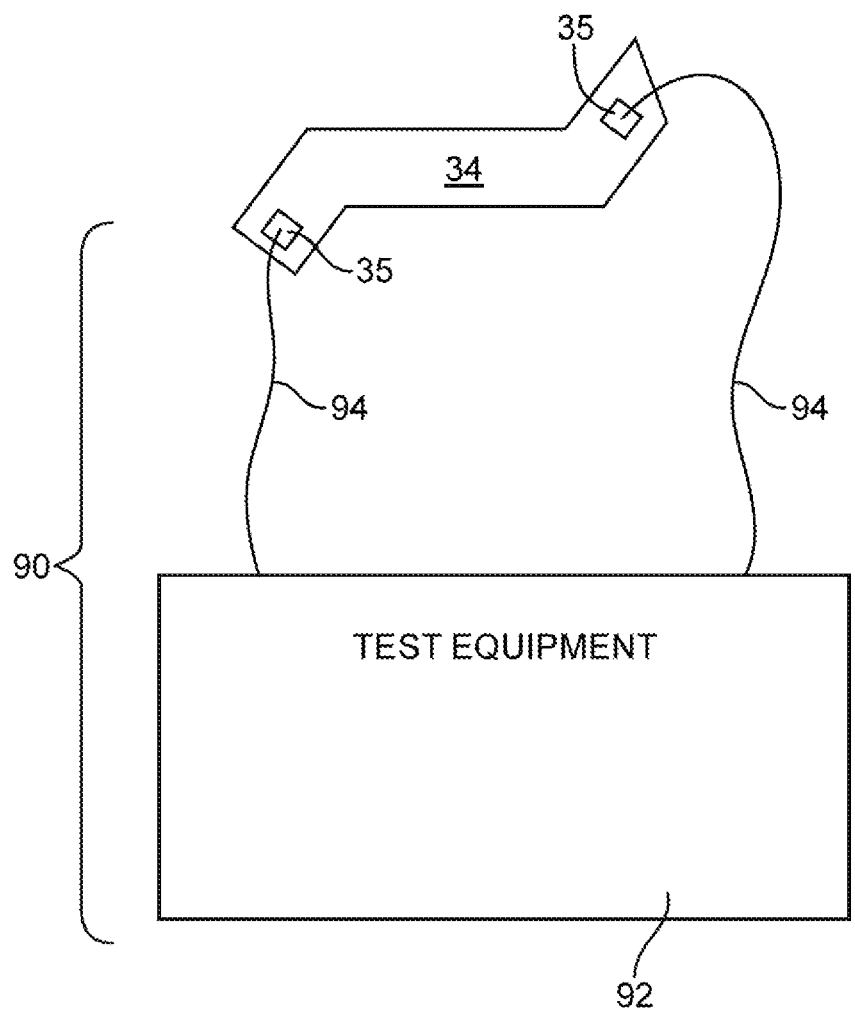
FIG. 15 is a diagram of an illustrative test system for programming and testing flexible circuitry in accordance with an embodiment of the present invention.

During manufacturing of device 10, flexible circuitry 34 may be connected to a test system such as test system 90 as shown in FIG. 15. Test system 90 may include test equipment 92 and one or more test cables 94. As shown in FIG. 15, test cables 94 may be connected to connectors 35 of flexible circuitry 34 during testing of flexible circuitry 34

Test equipment 92 may include computing equipment, monitoring equipment, programming equipment or other equipment for testing flexible circuitry 34 during manufacturing of device 10. For example, test equipment 92 may be configured to perform tests on flexible circuitry 34 to verify that flexible circuitry 34 has been programmed properly and is functioning properly (viability verification tests). During testing of flexible circuitry 34, test data may be conveyed between test equipment 92 and flexible circuitry 34.

Figure 16:
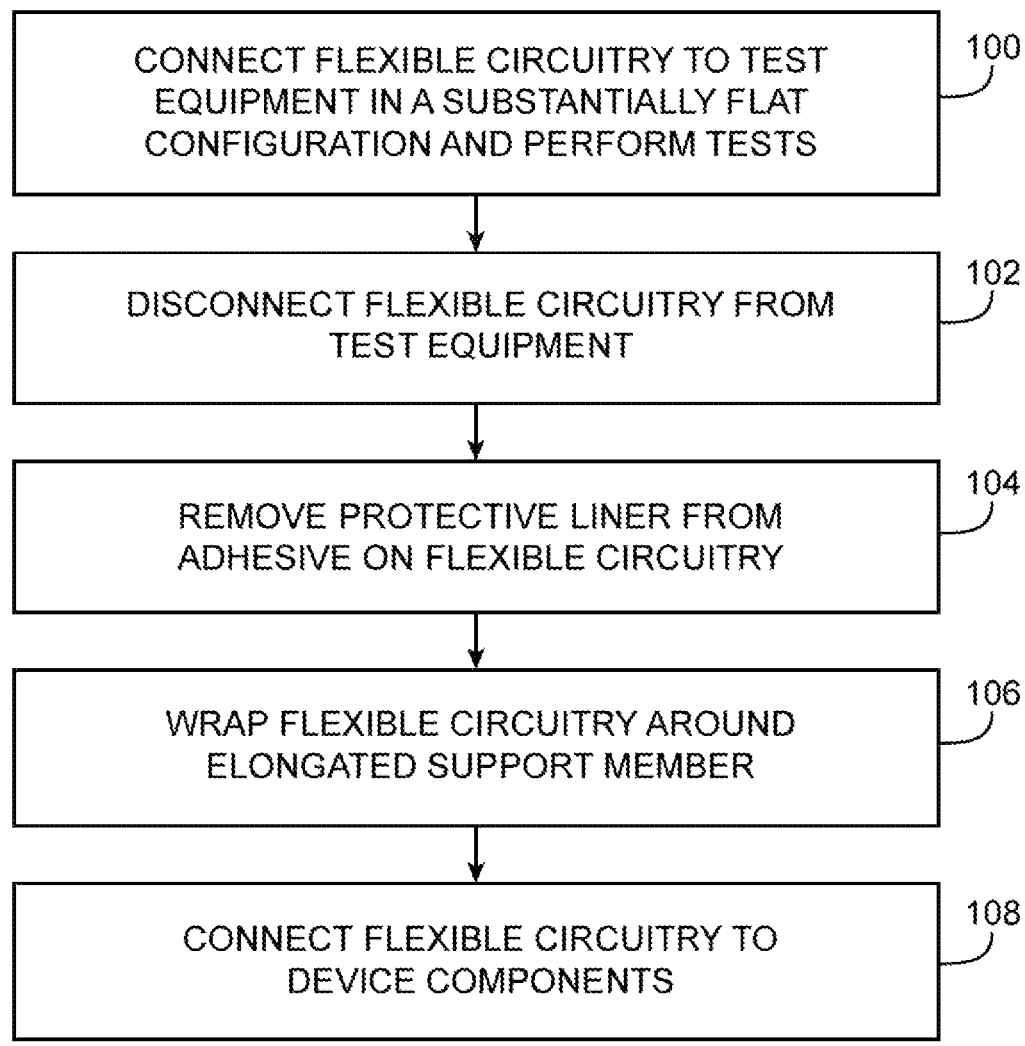
FIG. 16 is a flow chart of illustrative steps involved in testing and installing flexible circuitry for an electronic device in accordance with an embodiment of the present invention.

FIG. 16 is a flow chart of illustrative steps involved in manufacturing electronic device 10 of FIG. 1.

At step 100, flexible circuitry such as flexible circuitry 34 may be connected to test equipment such as test equipment 92 of FIG. 2 and testing and programming of flexible circuitry 34 may be performed.

At step 102, flexible circuitry 34 may be disconnected from test equipment 92.

At step 104, if flexible circuitry 34 has successfully passed testing, a protective liner such as protective layer 62 may be removed from an adhesive strip such as adhesive strip 60 of FIG. 8.

At step 106, flexible circuitry 34 may be wrapped around an elongated support member such as support member 38 of (for example) FIG. 4. Flexible circuitry 34 may be wrapped in a spiral wrap so that adhesive 60 on a first side of flexible circuitry 34 bonds to an opposing side of flexible circuitry 34 or to support member 38 forming seams 44. If desired, flexible circuitry 34 may be wrapped in a spiral wrap so that contacts such as contacts 46 of FIGS. 13 and 14 on a first side of flexible circuitry 34 form an electrical connection with contacts 46 on an opposing side of flexible circuitry 34 at seams 44.

At step 108, connectors 35 of flexible circuitry 34 that has been wrapped in a spiral wrap around a support member may be electrically connected to device components such as components 30, 30' and 32. If desired, the support member may be removed from the spiral wrap. However, this is merely illustrative. If desired, the support member may remain in the spiral wrap.

The foregoing is merely illustrative of the principles of this invention and various modifications can be made by those skilled in the art without departing from the scope and spirit of the invention.

What is claimed is:

1. An electronic device, comprising:
a printed circuit board;
an elongated support member mounted along an edge of the printed circuit board; and
flexible circuitry that is wrapped around the elongated support member and electrically coupled to the printed circuit board, wherein the flexible circuitry comprises a flexible printed circuit, wherein the flexible printed circuit comprises a first connector attached to a first portion of the printed circuit board and a second connector attached to a second portion of the printed circuit board, and wherein the second portion of the printed circuit board is displaced from the first portion of the printed circuit board along a lateral dimension of the printed circuit board that is parallel to an elongated dimension of the elongated support member.

2. The electronic device defined in claim 1, further comprising a housing, wherein the elongated support member comprises an engagement member attached to the housing.

3. The electronic device defined in claim 1 wherein the elongated support member comprises an engagement member attached to the printed circuit board.

4. The electronic device defined in claim 1, further comprising an electronic component, wherein the elongated support member includes at least one planar surface, wherein a portion of the flexible printed circuit is wrapped adjacent to the at least one planar surface, and wherein the electronic component is mounted to the portion of the flexible printed circuit.

5. The electronic device defined in claim 4 wherein the portion of the flexible printed circuit further comprises an internal rigid member that locally stiffens the flexible printed circuit for mounting the electronic component.

6. The electronic device defined in claim 1 wherein the flexible printed circuit further comprises a conductive ground layer.

7. The electronic device defined in claim 6, further comprising an electronic component, wherein the conductive ground layer is configured to form an electromagnetic shield for the electronic component.

8. An electronic device, comprising:
a printed circuit board;
an elongated support member mounted along an edge of the printed circuit board;
flexible circuitry that is wrapped around the elongated support member and electrically coupled to the printed circuit board, wherein the flexible circuitry comprises a flexible printed circuit;
an electronic component, wherein the flexible printed circuit comprises a first connector attached to the printed circuit board and a second connector attached to the electronic component; and
a housing having a lower portion and an upper portion that is configured to pivot with respect to the lower portion, wherein the printed circuit board is mounted in the lower portion and wherein the electronic component is mounted in the upper portion.

9. A electronic device, comprising:
a printed circuit board; and
a flexible printed circuit having an adhesive strip and first and second connectors, wherein the first connector is attached to a first portion of the printed circuit board and the second connector is attached to a second portion of the printed circuit board, wherein the second portion is displaced from the first portion along a lateral dimension of the printed circuit board, wherein the flexible printed circuit is formed in a spiral wrap that extends along the lateral dimension of the printed circuit board, and wherein the adhesive strip is configured to prevent unwrapping of the spiral wrap.

10. The electronic device defined in claim 9 wherein the first and second portions of the printed circuit board each comprise a portion of a common surface of the printed circuit board.

11. The electronic device defined in claim 9 wherein the first portion of the printed circuit board comprises a portion of a first surface of the printed circuit board and wherein the second portion of the printed circuit board comprises a portion of an opposing second surface of the printed circuit board.

12. The electronic device defined in claim 9 wherein the flexible printed circuit comprises a first surface having an edge and an opposing second surface, wherein the adhesive strip is formed along the edge of the first surface, and wherein the adhesive strip attaches the edge of the first surface to the opposing second surface.

13. The electronic device defined in claim 9, further comprising a support member that extends along the lateral dimension of the printed circuit board, wherein the flexible printed circuit comprises a surface having an edge, wherein the adhesive strip is formed along the edge, wherein the spiral wrap runs around the support member, and wherein the adhesive strip attaches the edge to the support member.

14. An electronic device, comprising: a tubular flexible printed circuit; and circuitry coupled to the tubular flexible printed circuit, wherein the tubular flexible printed circuit comprises a spirally wrapped flexible printed circuit and wherein the spirally wrapped flexible printed circuit has a first end coupled to the printed circuit board at a first location and has a second end coupled to the printed circuit board at a second location.

15. The electronic device defined in claim 14 wherein the circuitry that is coupled to the tubular flexible printed circuit comprises at least one integrated circuit mounted to the printed circuit board.

\* \* \* \* \*